(12) United States Patent
Schrank

(10) Patent No.: US 8,531,041 B2
(45) Date of Patent: Sep. 10, 2013

(54) SEMICONDUCTOR COMPONENT HAVING A PLATED THROUGH-HOLE AND METHOD FOR THE PRODUCTION THEREOF

(75) Inventor: Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/501,399

(22) PCT Filed: Sep. 22, 2010

(86) PCT No.: PCT/EP2010/063985
§ 371 (c)(1),
(2), (4) Date: Jun. 29, 2012

(87) PCT Pub. No.: WO2011/045153
PCT Pub. Date: Apr. 21, 2011

(65) Prior Publication Data
US 2012/0280392 A1 Nov. 8, 2012

(30) Foreign Application Priority Data
Oct. 13, 2009 (DE) .......................... 10 2009 049 102

(51) Int. Cl.
*H01L 23/48* (2006.01)

(52) U.S. Cl.
USPC .............. 257/780; 257/779; 257/E21.508; 257/E23.021; 438/613; 438/687

(58) Field of Classification Search
USPC .............. 257/672, 737, 738, 772, 779, 780, 257/E21.508, E23.021; 438/612–614, 648, 438/652, 687
See application file for complete search history.

(56) References Cited

U.S. PATENT DOCUMENTS

| | | | |
|---|---|---|---|
| 5,741,733 A | 4/1998 | Bertagnolli et al. | |
| 5,846,879 A | 12/1998 | Winnerl et al. | |
| 6,110,825 A | 8/2000 | Mastromatteo et al. | |
| 6,352,923 B1 | 3/2002 | Hsuan et al. | |
| 6,426,289 B1 * | 7/2002 | Farrar | 438/670 |
| 7,772,116 B2 * | 8/2010 | Akram et al. | 438/667 |
| 8,110,886 B2 | 2/2012 | Meinhardt et al. | |
| 2005/0082685 A1 * | 4/2005 | Bojkov et al. | 257/780 |
| 2005/0151228 A1 | 7/2005 | Tanida et al. | |
| 2006/0043599 A1 | 3/2006 | Akram et al. | |
| 2006/0057836 A1 | 3/2006 | Nagarajan et al. | |
| 2006/0076641 A1 * | 4/2006 | Cho et al. | 257/528 |
| 2007/0037379 A1 | 2/2007 | Enquist et al. | |
| 2008/0057620 A1 | 3/2008 | Pratt | |
| 2008/0283959 A1 | 11/2008 | Chen et al. | |
| 2009/0102021 A1 | 4/2009 | Chen et al. | |
| 2010/0314762 A1 | 12/2010 | Schrank et al. | |
| 2011/0260284 A1 | 10/2011 | Schrank et al. | |

FOREIGN PATENT DOCUMENTS

| | | |
|---|---|---|
| DE | 4314913 | 8/1994 |
| DE | 4400985 | 5/1995 |
| DE | 19702121 | 6/1998 |
| DE | 2005026242 | 12/2006 |

(Continued)

*Primary Examiner* — David Vu

(74) *Attorney, Agent, or Firm* — McDermott Will & Emery LLP

(57) ABSTRACT

A connection contact layer (4) is disposed between semiconductor bodies (1,2). In the second semiconductor body (2), a recess is provided. A connection layer (7) on the top face extends as far as the recess, in which a metallization (10) is present that conductively connects the connection contact layer (4) to the connection layer (7) in an electrical manner. A polymer (8) or a further metallization is present in the recess.

14 Claims, 4 Drawing Sheets

(56) References Cited

FOREIGN PATENT DOCUMENTS

| DE | 102007034306 | 4/2009 |
| DE | 102008033395 | 2/2010 |
| EP | 1653509 | 5/2006 |
| JP | 2007096233 | 4/2007 |

* cited by examiner

SEMICONDUCTOR COMPONENT HAVING A PLATED THROUGH-HOLE AND METHOD FOR THE PRODUCTION THEREOF

RELATED APPLICATIONS

This is a U.S. national stage of application No. PCT/EP2010/063985, filed on Sep. 22, 2010. Priority is claimed on the following application: German Application No.: 10 2009 049 102.3 filed on Oct. 13, 2009, the disclosure content of which is hereby incorporated here by reference.

FIELD OF THE INVENTION

The present invention relates to a plated through-hole with which electrical conductors on two facing main sides of a semiconductor body can be electroconductively connected to one another.

BACKGROUND OF THE INVENTION

Plated through-holes through semiconductor wafers are provided particularly for three-dimensional or cubic integration of semiconductor circuits. Contact holes, so-called vias, that pass completely through the semiconductor body are provided with metallic conductors that are electroconductively connected to printed conductors or other metallic terminals on the opposite sides of the semiconductor body. If several semiconductor wafers are arranged one on top of another and are permanently connected to one another, the plated through-holes can be used for electrical connections of the components produced on the individual wafers. Thereby three-dimensionally integrated electronic circuits can be produced.

Plated through-holes through the semiconductor wafer are described in U.S. Pat. No. 6,110,825, U.S. Pat. No. 6,352,923, US 2008/0283959 and US 2009/0102021, for example.

SUMMARY OF THE INVENTION

One object of the present invention is to provide a semiconductor component having a plated through-hole and an associated production method.

A first semiconductor body is connected to a second semiconductor body in the semiconductor component. Such a connection of two semiconductor bodies can be produced with one of the conventionally known methods of wafer bonding. An electrically conductive, in particular metallic, connection contact layer is arranged between the semiconductor bodies, in particular, in a dielectric present between the semiconductor bodies. The dielectric can be an inter-metal dielectric for wiring layers. In the second semiconductor layer, there is a recess that reaches from the connection contact layer to an opposing upper side of the second semiconductor body facing away from the connection contact layer, so that the recess completely penetrates the second semiconductor body. An electrically conductive, in particular metallic, connection layer that reaches up to the recess is present on this upper side. Conductor traces can be structured in this connection layer. A metallization that electroconductively connects the connection contact layer to the connection layer is present in the recess. A polymer or an additional metallization is present in the recess.

In one embodiment example of the semiconductor component, an electrically conductive polymer is situated in the recess.

In another embodiment example, an under-bump metallization (UBM) is present as an additional metallization in the recess.

In another embodiment example, the recess is filled with the polymer or with the additional metallization.

In the method for producing a plated through-hole in a semiconductor component, a first semiconductor body is furnished with an electrically conductive, in particular metallic, connection contact layer and is then connected to a second semiconductor body in such a manner that the connection contact layer is arranged on the side of the first, semiconductor body facing the second semiconductor body. The second semiconductor body can be furnished on the upper side facing away from the first semiconductor body with structures of a component or an integrated circuit and/or wiring, for example. A recess in which the connection contact layer is exposed is produced in the second semiconductor body. A metallization is applied and structured in such a manner that the connection contact layer is electroconductively connected to the metallization. An electrically conductive, in particular metallic, connection layer is applied and structured in such a manner that the connection layer extends up to the recess and is electroconductively connected to the metallization. In this manner, an electroconductive connection is produced between the connection contact layer and the connection layer. A polymer or an additional metallization is introduced into the recess. In particular, an electrically conductive polymer or an under-bump metallization as an additional metallization can be used for this purpose.

In one embodiment example of the process, the connection contact layer is arranged in a dielectric on the first semiconductor body. The dielectric can be an inter-metal dielectric for wiring layers. Before the connection of the first semiconductor body to the second semiconductor body, an upper side of the connection contact layer facing away from the first semiconductor body is exposed by removing the dielectric from this upper side of the connection contact layer.

In another embodiment example of the method, an electrically insulating layer is applied in the recess and etched back to form a sidewall spacer before the metallization is applied. The electrically insulating layer is provided to prevent a short circuit between the semiconductor material of the second semiconductor body and the plated through-hole.

In another embodiment example of the method, the recess is filled with an under-bump metallization.

In another embodiment example of the method, the recess is filled with a polymer, in particular, an electrically conductive polymer.

In another embodiment example of the method, parts of the polymer that project above the recess are planarized until the connection layer is reached, and a passivation layer is applied.

In another embodiment example of the method, the passivation layer above the polymer is removed, the polymer is removed and an additional metallization is applied in the recess. The additional metallization can be an under-bump metallization. In this variant of the method, the polymer serves as a sacrificial layer with which a flat upper side is produced for further process steps, in particular, the full-surface application of the passivation layer. The recess can also be filled up with an under-bump metallization in this variant. For larger recesses, however, it is sufficient if the under-bump metallization does not fill up the recess, but merely covers the sidewalls and the bottom, including the connection contact layer.

In another embodiment example of the method, an electrically conductive liner is applied in the recess before introduction of the polymer or additional metallization. In particular, the liner can comprise TiN, Ti/TiN in the case of a metallization made of tungsten and can comprise TaN, Ta/TaN in the case of a metallization of copper, and can be applied by sputtering, for example.

A more precise description of the plated through-hole and the production method will follow, with reference to the appended figures.

DETAILED DESCRIPTION OF THE DRAWINGS

Figure 1:
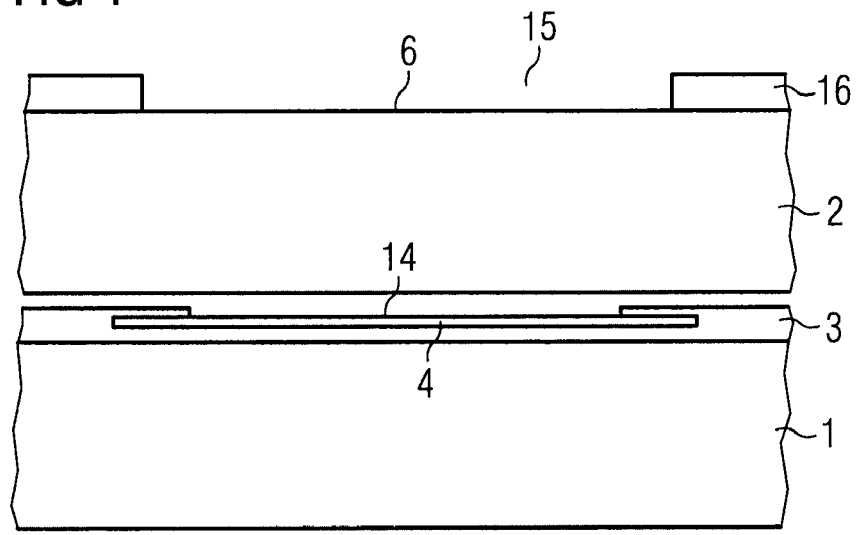
FIG. 1 shows a cross section of two semiconductor bodies to be connected to one another.

FIG. 1 shows a first semiconductor body 1 and a second semiconductor body 2 in cross section, which are connected to one another in the illustrated arrangement by means of wafer bonding, for example. A dielectric 3, which can be an inter-metal dielectric for wiring layers of a circuit integrated in the first semiconductor body 1, is located on the first semiconductor body 1. The dielectric 3 can be an oxide of the semiconductor material, such as silicon dioxide. On the upper side 6 of the second semiconductor body 2 facing away from the first semiconductor body 1, a dielectric 16 can correspondingly be present, as an inter-metal dielectric for wiring layers or with other structures, for example. The semiconductor bodies 1, 2 can be connected to one another via the dielectric 3. Instead of an inter-metal dielectric, a separate connection layer such as an oxide of the semiconductor material can be provided for creating the connection. Before the connection of the semiconductor bodies 1, 2, the upper side of the dielectric 3 or the connection layer can be planarized and smoothed, for example by means of CMP (chemical mechanical polishing).

A connection contact layer 4 that is provided for forming the plated through-hole is arranged in the dielectric 3. The connection contact layer 4 is formed by a metal layer, for example, and can be, in particular, a structured portion of the metallization level of a wiring structure. In one embodiment example of the method, the upper side 14 of the connection contact layer 4 that is facing away from the semiconductor body 1 is exposed by removing the dielectric 3 before the connection of the semiconductor bodies 1, 2. Even before connection of the semiconductor bodies 1, 2, the dielectric 16 of the second semiconductor body 2 can likewise be provided with an opening 15 in which the upper side 6 of the second semiconductor body 2 is exposed. Instead of that, the opening 15 can be produced after the connection of the semiconductor bodies 1, 2.

When the semiconductor bodies 1, 2 are connected to one another, a recess 5 is produced in the second semiconductor body 2 from the upper side 6 in the area of the opening 15 of the dielectric 16, which can be done with a known etching method, particularly by means of DRIE (deep reactive ion etching). The recess 5 is produced in such a manner that it completely penetrates the second semiconductor body 2 and thus includes the entire thickness of the second semiconductor body 2.

Figure 2:
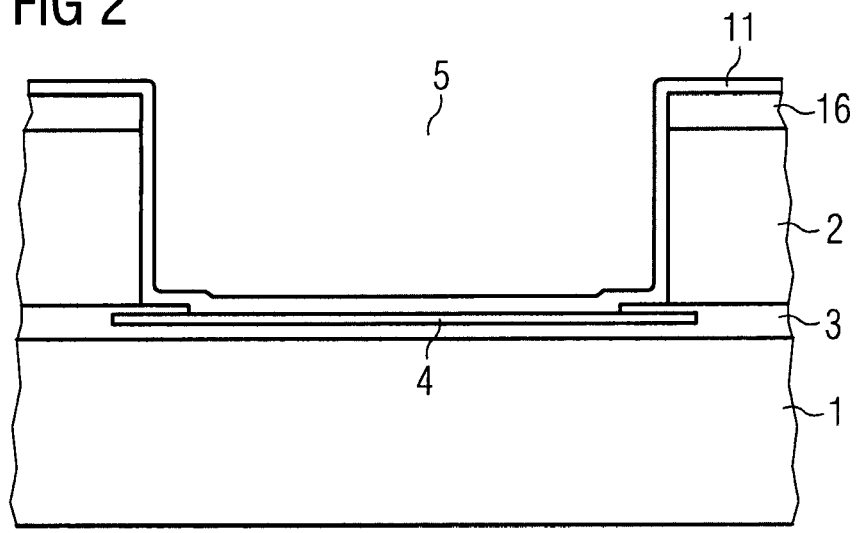
FIG. 2 shows the connected semiconductor bodies in cross section after the production of a recess and the application of an electrically insulating layer.

FIG. 2 shows a cross section of the connected semiconductor bodies 1, 2 after the recess 5 has been produced and an electrically insulating layer 11, made of an oxide of the semiconductor material for example, has been conformally applied. The electrically insulating layer 11 is subsequently anisotropically etched back to form a spacer with which the sidewall of the recess 5 remains covered. If the dielectric 3 has already been removed from the upper side 14 of the connection contact layer 4 before connection of the semiconductor bodies 1, 2, and now only the electrically insulating layer 11 is therefore present on the upper side 14 of the connection contact layer 4, only the relatively thin electrically insulating layer 11 need be removed from the bottom of the recess 5 in order to again expose the upper side 14 of the connection contact layer 4. A CMP step can be performed beforehand in order to adjust the ratio of the layer thicknesses of the electrically insulating layer 11 on the upper side and on the bottom of the recess, in view of the differing etching rates at these points. This ensures that, after the etching of the sidewall spacer and the exposure of the upper side of the connection contact layer 4, the semiconductor material of the second semiconductor body 2 is covered and electrically insulated by the upper-side dielectric 16 and the sidewall spacer and, if necessary, electrical connection points on or above the upper side of the second semiconductor body 2 have been exposed.

Figure 3:
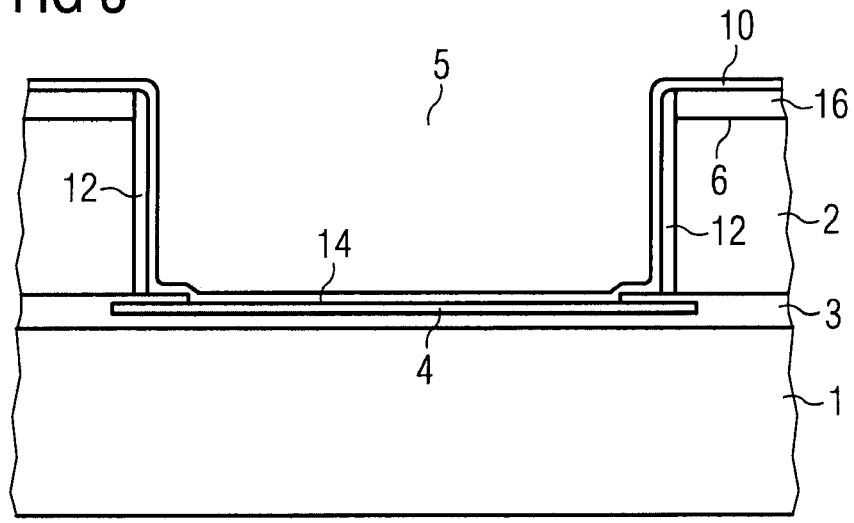
FIG. 3 shows a cross section according to FIG. 2 after the etching back of the electrically insulating layer to form a sidewall spacer and the application of a metallization.

FIG. 3 shows a cross section according to FIG. 2 after etching of the sidewall spacer 12 and application of a metallization 10, which can be tungsten or copper, for example. In this embodiment, the material of the electrically insulating layer 11 has been completely removed from the upper side and from the bottom of the recess 5. The metallization 10 contacts the connection contact layer 4. A thin electrically conductive liner, on which the metallization 10 is applied, can be applied over the entire surface before application of the metallization 10. The liner can comprise Ti, especially if the metallization 10 is tungsten. For a plated through-hole with a smaller diameter, the liner can be a thin TiN layer, which can be applied by MOCVD (metal-organic chemical vapor deposition), for example. For a plated through-hole with a larger diameter, a combination of Ti and TiN is particularly suitable as a liner, and can be produced by sputtering, for example. The metallization 10 can alternatively be made of copper, for example, using a plating process. For a metallization 10 made of copper, a liner comprising Ta, such as a combination of Ta and TaN, is preferred.

Figure 4:
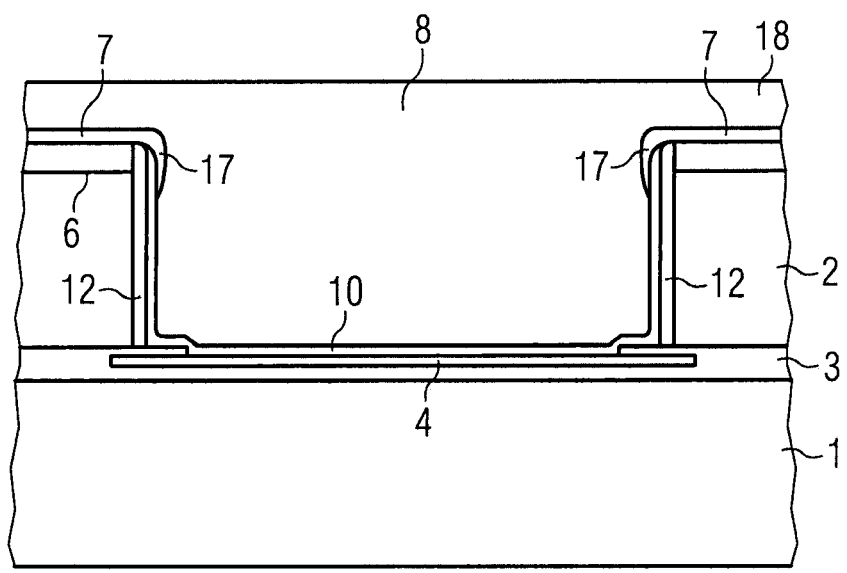
FIG. 4 shows a cross section according to FIG. 3 after the application and structuring of a metallic connection layer and the introduction of a polymer.

FIG. 4 shows a cross section according to FIG. 3 after the upper-side etch-back of the metallization 10 and the application and structuring of an electrically conductive connection layer 7, for example, a connection layer 7 made of aluminum. The connection layer 7 is structured in such a manner that it has a portion 17 that reaches up to the side wall of the recess 5 and contacts the metallization 10 there. In this manner, an electrically conductive connection from the connection contact layer 4 to the upper-side connection layer 7 is produced.

The metallization 10 thus forms the vertical electrically conductive connection between the two main sides of the second semiconductor body 2.

The recess 5 is filled up in this embodiment example with a polymer 8 that, in particular, can be electrically conductive. A portion 18 of the polymer 8 that projects beyond the recess 5 is then optionally removed, which can be done with a dry etching process in the nature of ashing. In this manner, an essentially flat upper side at the level of the connection layer 7 is produced.

Figure 5:
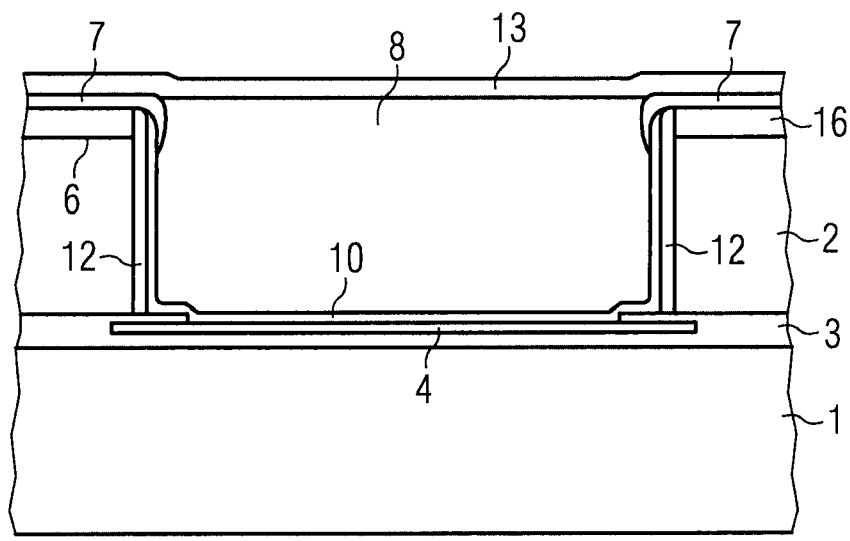
FIG. 5 shows a cross section according to FIG. 4 after the planarizing removal of the polymer and the application of a passivation layer.

FIG. 5 shows a cross section according to FIG. 4 after the planarization of the upper side and the application of a passivation layer 13 over the entire surface. The passivation layer 13 can be applied particularly well if the upper side with the polymer 8 is planarized. A flat upper side is also advantageous for further process steps that can be performed as part of the overall manufacturing process and can comprise photolithography steps and the production of solder balls, bumps or underfill. The use of an electrically conductive polymer 8 is advantageous in order to reduce the electrical resistance of the plated through-hole.

Figure 6:
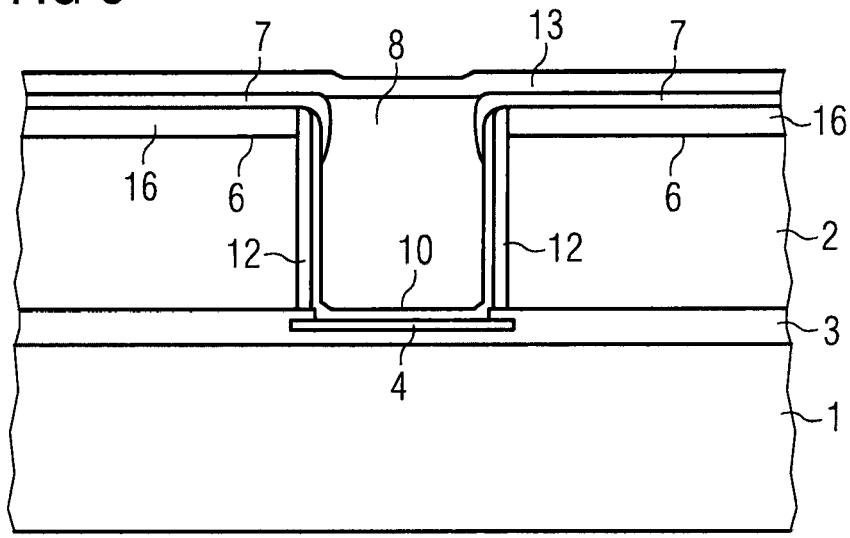
FIG. 6 shows a cross section according to FIG. 5 of an embodiment example with a different aspect ratio of the recess.

FIG. 6 shows a cross section according to FIG. 5 of a plated through-hole with a different aspect ratio as compared to the embodiment example of FIG. 5. In the embodiment example of FIG. 6, the lateral dimension of the plated-through-hole—for a cylindrical plated through-hole this is its diameter—is smaller than in the embodiment example of FIG. 5, so that the plated through-hole has a greater depth in relation to its lateral dimension. The different aspect ratios of the plated through-holes are obtained by a suitable adaptation of the etching method with which the recess 5 is etched out.

Figure 7:
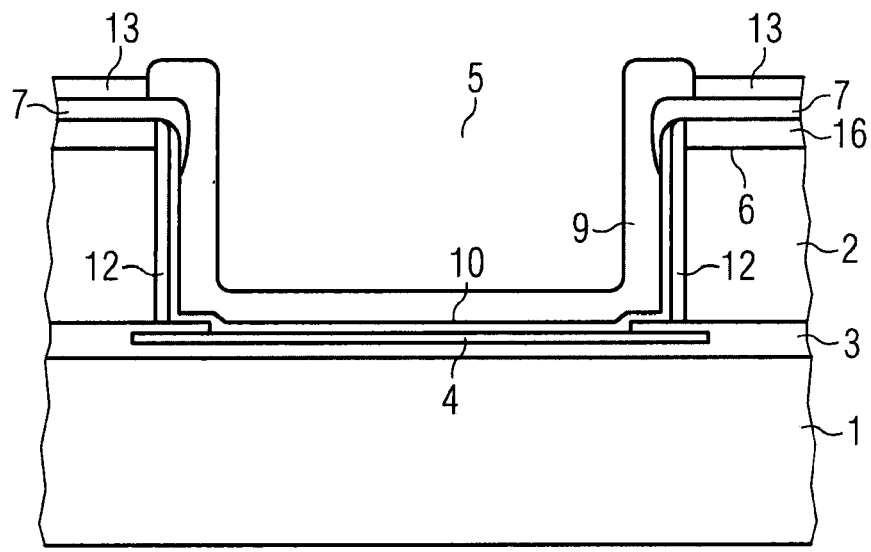
FIG. 7 shows a cross section according to FIG. 5 of an embodiment example with an under-bump metallization.

FIG. 7 shows an additional embodiment example in which a further metallization 9, in particular, an under-bump metallization (UBM), is applied instead of the polymer 8 to the metallization 10 in the recess 5.

Figure 8:
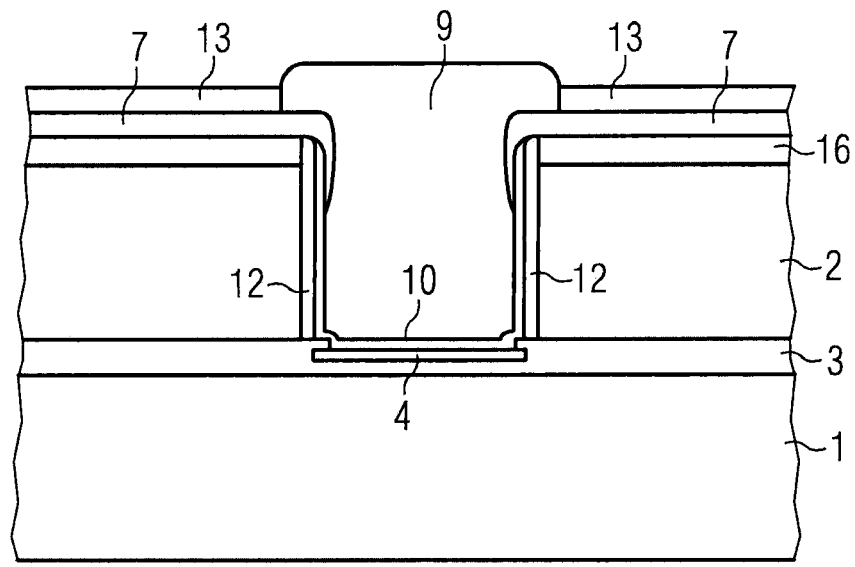
FIG. 8 shows a cross section according to FIG. 7 of an embodiment example with a different aspect ratio of the recess, in which the recess is completely filled with an under-bump metallization.

FIG. 8 shows an additional embodiment example according to FIG. 7, in which the plated through-hole has a different aspect ratio and the recess 5 is completely filled with the further metallization 9. The embodiment examples of FIGS. 7 and 8 can be produced, for example, by first introducing a polymer 8 into the recess 5 and planarizing its upper end. The polymer 8 is used in this variant of the method as a sacrificial layer, with the aid of which a flat upper side is formed for the subsequent process steps. After the application of the planarization layer 13, an opening is made in the planarization layer 13 above the polymer 8 by means of a suitable mask. The polymer 8 is then removed, so that the metallization 10 in the recess 5 is exposed. Then the further metallization 9 is applied to the metallization 10.

It is advantageous in the production method if the connection contact layer 4 is exposed on the upper side before the semiconductor bodies 1, 2 are connected to one another. In the subsequent spacer etching, only the electrically insulating layer 11 on the bottom of the recess, which is thin in comparison to the dielectric 3, need be removed, thus ensuring that sufficient electrically insulating material remains at the upper edges of the recess to be able to securely prevent any short circuits from appearing there.

Filling up the recess of the plated through-hole has the advantage that a flat upper side is formed, which favors subsequent process steps, particularly the application of a passivation. If an electrically conductive material is used for filling the recess, the filling material additionally reduces the electrical resistance of the plated through-hole. The use of an under-bump metallization has the advantage that this design is particularly suitable for the use of solder balls for external electrical connection.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor component having a plated through-hole, comprising
    a first semiconductor body of semiconductor material connected to a second semiconductor body of semiconductor material;
    an electrically conductive connection contact layer arranged between the semiconductor bodies;
    in the second semiconductor body a recess extending from the connection contact layer up to an upper side of the second semiconductor body facing away from the connection contact layer;
    an electrically conductive connection layer arranged on the upper side of the second semiconductor body, the connection layer extending up to and in contact with a side wall of the recess;
    a metallization comprising tungsten or copper that electroconductively connects the connection contact layer to the connection layer formed in the recess on an electrically conductive liner that comprises Ti or Ta; and
    a polymer or a further metallization formed in the recess.

2. The semiconductor component according to claim 1, wherein the polymer or the further metallization fills up the recess.

3. The semiconductor component according to claim 1, wherein the polymer is an electrically conductive polymer.

4. The semiconductor component according to claim 1, wherein the further metallization is an under-bump metallization.

5. A method for producing a plated through-hole in a semiconductor component, comprising:
    a first semiconductor body of semiconductor material is provided with an electrically conductive connection contact layer and is connected to a second semiconductor body of semiconductor material in such a manner that the connection contact layer is arranged on a side of the first semiconductor body facing the second semiconductor body;
    a recess in which the connection contact layer is exposed is produced in the second semiconductor body;
    an electrically conductive liner that comprises Ti or Ta is applied and a metallization of tungsten or copper is applied thereon and structured in such a manner that the connection contact layer is electroconductively connected to the metallization;
    an electrically conductive connection layer is applied and structured in such a manner that the connection layer is arranged on an upper side of the second semiconductor body and extends up to and in contact with a side wall of the recess such that the connection layer is electroconductively connected to the metallization; and
    a polymer or a further metallization is introduced into the recess.

6. The method according to claim 5, wherein the connection contact layer is arranged in a dielectric on the first semiconductor body, and an upper side of the connection contact layer facing away from the first semiconductor body is exposed before the connection of the first semiconductor body to the second semiconductor body.

7. The method according to claim 5, wherein an electrically insulating layer is applied in the recess and etched back to form a side wall spacer before the metallization is applied.

8. The method according to claim 5, wherein the recess is filled with an electrically conductive polymer.

9. The method according to claim 5, wherein the recess is provided with an under-bump metallization as a further metallization.

10. The method according to claim 9, wherein the recess is filled with the under-bump metallization.

11. The method according to claim 5, wherein the recess is filled with the polymer, a portion of the polymer that projects past the recess is removed in a planarizing manner until the connection layer is reached, and a passivation layer is applied.

12. The method according to claim 11, wherein the passivation layer above the polymer is removed, the polymer is removed, and a further metallization is applied in the recess.

13. The method according to claim 12, wherein an under-bump metallization is applied as the further metallization in the recess.

14. The method according to claim 12, wherein the recess is filled with the further metallization.

* * * * *